US006844774B1

(12) United States Patent
Hood

(10) Patent No.: US 6,844,774 B1
(45) Date of Patent: Jan. 18, 2005

(54) METHOD AND APPARATUS FOR PROVIDING WELL-MATCHED SOURCE AND SINK CURRENTS

(75) Inventor: David Alan Hood, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/663,222

(22) Filed: Sep. 15, 2003

(51) Int. Cl.[7] .................................................. G05F 1/10
(52) U.S. Cl. ........................................................ 327/543
(58) Field of Search ................................ 323/315, 316; 327/530, 534, 535, 537, 538, 539, 540, 541, 543

(56) References Cited

U.S. PATENT DOCUMENTS

| 5,635,869 | A | * | 6/1997 | Ferraiolo et al. | ............ | 327/543 |
| 6,362,613 | B1 | * | 3/2002 | Rodriguez | ................... | 323/315 |
| 6,624,671 | B2 | * | 9/2003 | Fotouhi | ...................... | 327/112 |

OTHER PUBLICATIONS

GY Robinson, Wide–Swing Cascode Current Mirror, Colorado State University, EE480, published on or before Dec. 2002, 10 pages.

Fan You, et al., "An Improved Tail Current Source for Low Voltage Applications", IEEE Journal of Solid–State Circuits, vol., 32, No. 8, Aug. 1997, pp. 1173–1180.

"Analog and Mixed–Signal Center", Edgar Sanchez–Sinencio, Department of Electrical Engineering, Texas A&M University, published on or before Dec. 2002, 33 pages.

Lien Wee Liang, "Analog IC Design: Quick Reference to CMOS Current Sinks & Sources Part 3", Chip Center, The Web's Definitive Electronics Resource, 1999, 5 pages.

* cited by examiner

*Primary Examiner*—Jeffrey Zweizig

(57) ABSTRACT

Apparatus for providing well-matched source and sink currents includes a number of parallel current paths, a first of which drives a first current mirror to mirror current to second and third of the current paths. The second current path provides well-matched source and sink currents as outputs, and the third current path is matched to the second. The fourth and fifth current paths each comprise a transistor of a current steering mechanism and a bias transistor. Using a reference voltage, and feedback from the circuit, the fourth and fifth current paths steer current between the first, second and third current paths. A second current mirror is driven by a bias current to mirror the bias current to each of the number of parallel current paths. Other methods and apparatus are also disclosed.

18 Claims, 6 Drawing Sheets

US 6,844,774 B1

METHOD AND APPARATUS FOR PROVIDING WELL-MATCHED SOURCE AND SINK CURRENTS

BACKGROUND

Charge pumps of phase-locked loops (and other devices) require well-matched source and sink currents. Unfortunately, component manufacturing tolerances, signal noise and other factors can make obtaining well-matched source and sink currents difficult.

SUMMARY OF THE INVENTION

One aspect of the invention is embodied in apparatus for providing well-matched source and sink currents. The apparatus comprises a number of parallel current paths, a first of which drives a first current mirror to mirror current to second and third of the parallel current paths. The second parallel current path provides well-matched source and sink currents as outputs. The third parallel current path is matched to the second. Fourth and fifth of the parallel current paths each comprise a transistor of a current steering mechanism and a bias transistor. A first transistor of the current steering mechanism is coupled in the fourth current path and is driven by feedback from the third current path. A second transistor of the current steering mechanism is coupled in the fifth current path and is driven by a reference voltage. The bias transistor of the fourth current path mirrors current to the first current path under control of the current steering mechanism, and the bias transistor of the fifth current path mirrors current to the second and third current paths under control of the current steering mechanism. A second current mirror is driven by a bias current and mirrors the bias current to each of the number of parallel current paths.

Another aspect of the invention is embodied in a method for providing well-matched source and sink currents. The method comprises mirroring a bias current to each of a number of parallel current paths of a circuit. The bias current is then mirrored again, from a first of the parallel current paths to second and third of the parallel current paths (with the second and third current paths being matched). A reference voltage, and feedback from the circuit, is provided to a current steering mechanism comprising fourth and fifth of the parallel current paths. Current is then steered between the first and second current paths by means of the current steering mechanism. The well-matched source and sink currents are output from the second current path.

Other embodiments of the invention are also disclosed.

DESCRIPTION OF THE DRAWINGS

Illustrative embodiments of the invention are illustrated in the drawings, in which.

DETAILED DESCRIPTION OF THE INVENTION

Figure 1:
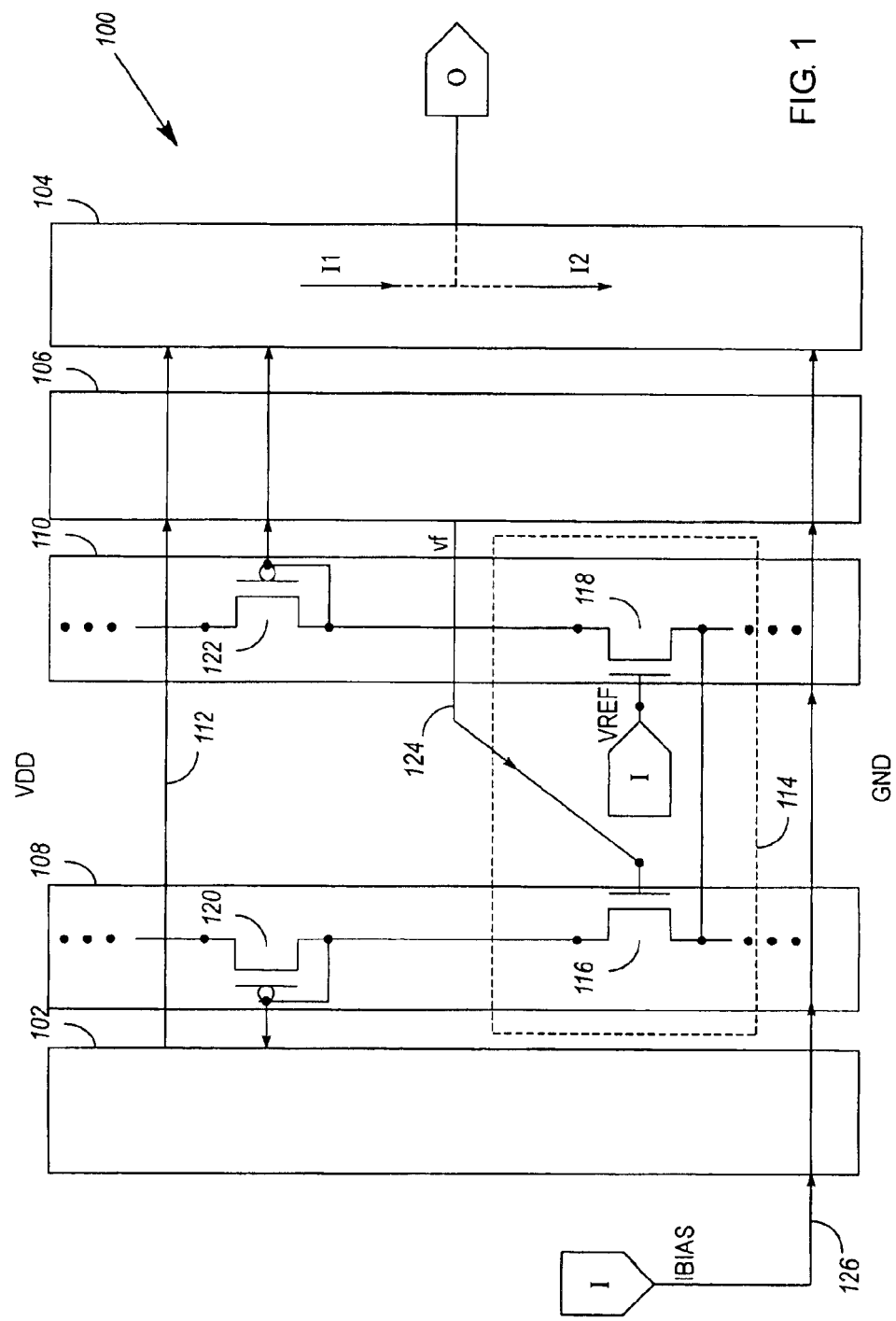
FIG. 1 illustrates a first exemplary circuit for providing well-matched source and sink currents.

FIG. 1 illustrates a first exemplary circuit 100 for providing well-matched source and sink currents. In general, the circuit 100 comprises a number of parallel current paths 102, 104, 106, 108, 110. A first of the parallel current paths 102 drives a first current mirror 112 to mirror current to second and third of the parallel current paths 104, 106. A second of the parallel current paths 104 provides well-matched source and sink currents (I1, I2) as outputs. A third of the parallel current paths 106 is matched to the second 104. The third current path may be used to provide feedback in the circuit 100, as will be explained in the next paragraph.

Fourth and fifth of the parallel current paths 108, 110 each comprise a transistor of a current steering mechanism 114, as well as a bias transistor 120, 122. A first transistor 116 of the current steering mechanism 114 is coupled in the fourth current path 108, and is driven by feedback 124 from the third current path 106. A second transistor 118 of the current steering mechanism 114 is coupled in the fifth current path 110, and is driven by a reference voltage (VREF). The bias transistors 120, 122 are respectively coupled in the fourth and fifth current paths 108, 110, and mirror current to the first, second and third current paths 102–106 under control of the current steering mechanism 114 (with the bias transistor 120 in the fourth current path mirroring current to the first current path 102, and with the bias transistor 122 in the fifth current path mirroring current to the second and third current paths 104, 106).

The circuit 100 further comprises a second current mirror 126. The second current mirror 126 is driven by a bias current (IBIAS) and mirrors the bias current to each of the number of parallel current paths 102–110.

Figure 2:
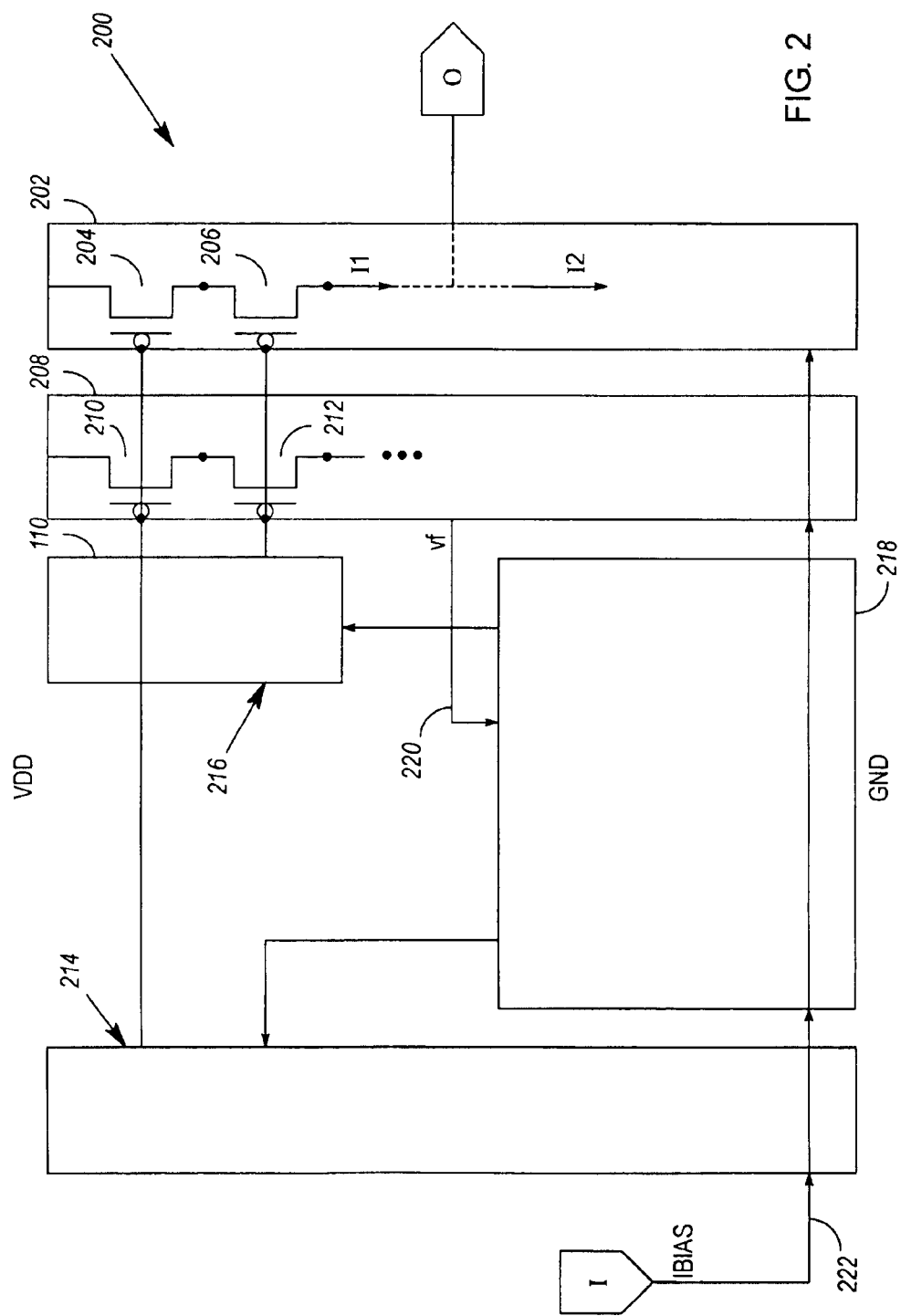
FIG. 2 illustrates a second exemplary circuit for providing well-matched source and sink currents.

FIG. 2 illustrates a second exemplary circuit 200 for providing well-matched source and sink currents. The circuit 200 comprises a first current path 202 that provides well-matched source and sink currents (I1, I2) as outputs. The source current, I1, is provided through a first pair of series transistors 204, 206. A second current path 208 is coupled in parallel with first current path 202. The second current path 202 comprises a second pair of series transistors 210, 212, matched to the first pair of series transistors 204, 206.

A first current mirror 214 mirrors current to first corresponding transistors 204, 210 of the first and second pairs of series transistors; and a second current mirror 216 mirrors current to second corresponding transistors 206, 212 of the first and second pairs of series transistors.

A current steering mechanism 218 receives a feedback signal 220 from the second current path 208, as well as a reference signal (e.g., VREF), and steers current between the first and second current sources to match the feedback signal to the reference signal.

A third current mirror 222 mirrors a bias current (IBIAS) to the first and second current paths, the first current mirror 214, and the current steering mechanism 218.

Figure 3:
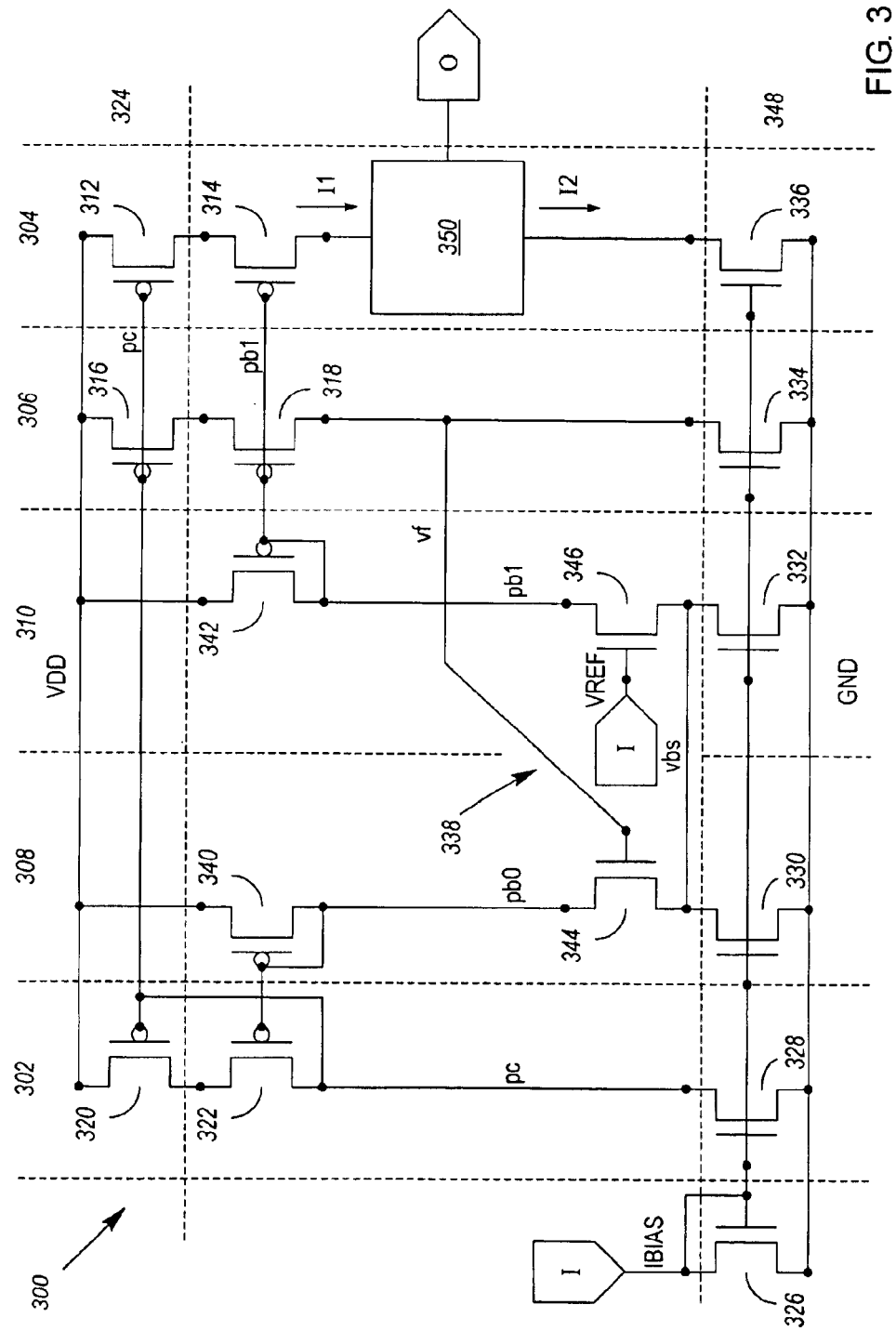
FIG. 3 illustrates a third exemplary circuit for providing well-matched source and sink currents.

FIG. 3 illustrates a third exemplary circuit 300 for providing well-matched source and sink currents. Of note, either of the circuits 100, 200 shown in FIG. 1 or 2 may be implemented as shown in FIG. 3.

The circuit 300 comprises five parallel current paths 302–310. First and second of the parallel current paths 304, 306 may each comprise a pair of series transistors 312/314, 316/318 to source current from a voltage source (VDD). The transistors of each pair (e.g., pair 312/314) are coupled in series via their sources and drains and, preferably, all of the transistors of both pairs are similarly sized. By way of example, FIG. 3 shows that each series pair of transistors comprises p-channel field effect transistors (PFETs).

Transistor 320 is coupled in series with transistor 322 in a third current path 302. Transistors 320 and 322 are coupled with respect to each other to form an over-the-shoulder cascode current mirror (i.e., with the gate of transistor 320 coupled to node "pc" of current path 302). The gate of transistor 320 is further coupled to the gates of transistors 312, 316 in the first and second current paths 304, 306. In this manner, the transistors 312, 316, 320 form a first current mirror 324.

The first and second current paths 304, 306 may comprise matched pairs of transistors 312/316, 314/318, 334/336. That is, transistors 316, 318, 334 in the second current path 306 are matched to corresponding transistors 312, 314, 336 in the first current path 304. Preferably, each pair of transistors is laid out using common centroid layout techniques. The second current path 306 allows feedback to be obtained on output currents I1 and I2 with less of an impact on the output currents. Due to the matched structures of the first and second current paths 304, 306, feedback that could be derived from the first current path 304 should be substantially identical to feedback that is derived from the second current path 306.

Each of fourth and fifth current paths 308, 310 may comprise a transistor 344, 346 of a current steering mechanism 338, as well as a bias transistor 340, 342. The bias transistors may each take the form of a diode connected PFET 340, 342 that is coupled gate-to-gate to with one or more corresponding PFETs 322, 314, 318 in the first, second and third current path 304, 306, 302. In one embodiment, the bias transistors 340, 342 are sized to about 25% of the driven transistors 314, 318, 322.

The current steering mechanism 338 may comprise an n-channel field effect transistor (NFET 344) that is coupled in the fourth current path 308 via its source and drain. The NFET 344 receives a feedback voltage (vf) at its gate. The feedback voltage (vf) is derived from the current path 306. The current steering mechanism 338 may also comprise a second NFET 346, coupled in the fifth current path 310 via its source and drain. The NFET 346 receives a reference voltage (VREF) at its gate. The drains of the steering mechanism's transistors 344, 346 are together at node "vbs".

A second current mirror 348 may comprise a plurality of NFETs 328, 330, 332, 334, 336 that couple each of the parallel current paths 302–320 to ground (GND) via their sources and drains. The gate of each NFET 328–336 is driven by the bias current (IBIAS), which is driven to the gates of the NFETs 328–336 by means of a diode-connected NFET 326. In this manner, the second current mirror 348 sinks current from each of the parallel current paths 302–310.

As configured in FIG. 3, the circuit 300 may be used to provide well-matched source and sink currents (I1 and I2) to any of a number of devices 350, including, for example, up/down current switches that serve as a charge pump to pump source and sink currents into a phase-locked loop in response to feedback received from the phase-locked loop. Preferably, the feedback path "vf" would include the same switching circuitry as device 350, but have control inputs hard-wired to their ON states.

Figure 4:
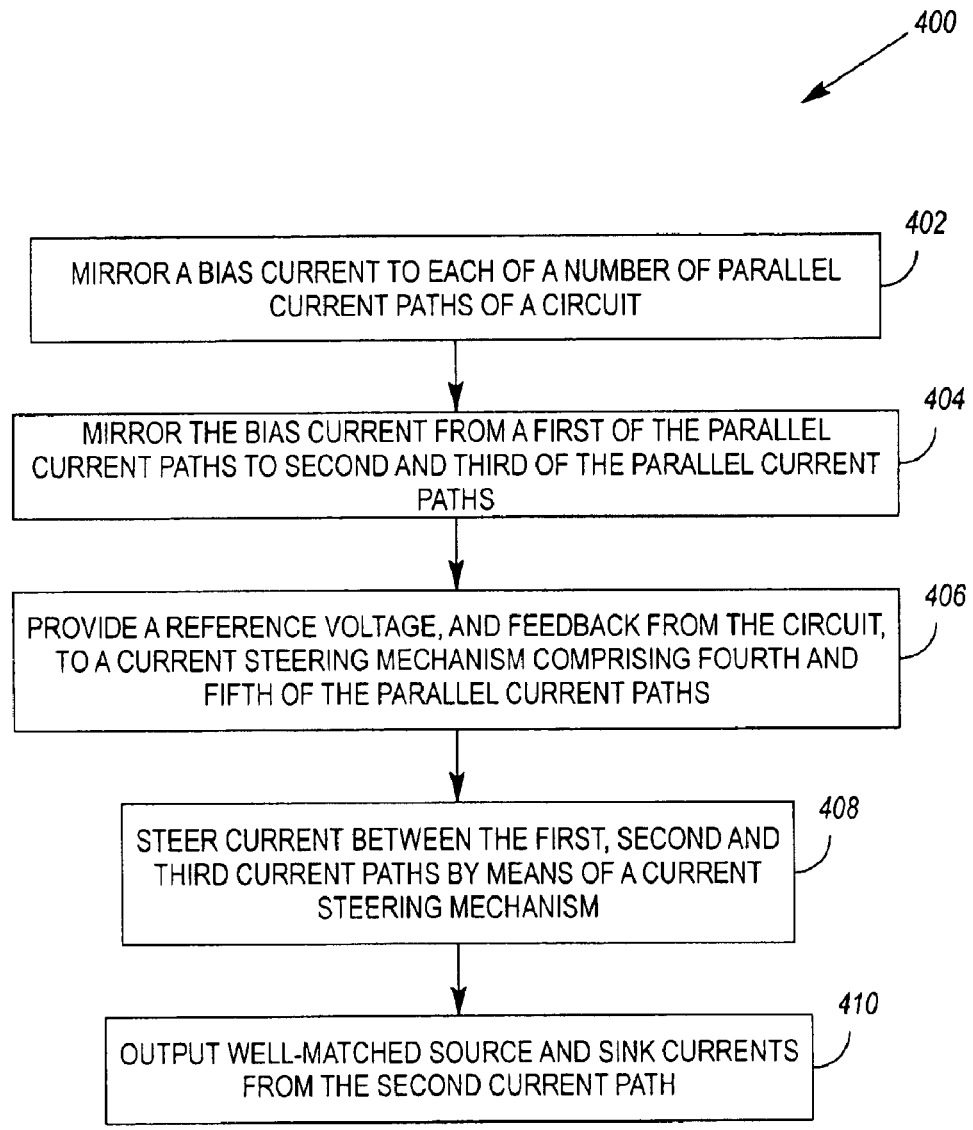
FIG. 4 illustrates an exemplary method for providing well-matched source and sink currents.

FIG. 4 illustrates a method 400 for providing well-matched source and sink currents. By way of example, the method 400 may be executed using the circuits shown in any of FIGS. 1–3.

In accordance with the method 400, a bias current (IBIAS) is mirrored 402 to each of a number of parallel current paths of a circuit. Referring back to FIG. 3, one sees that this may be done using the transistors 326–336 of the second current mirror 348. The bias current is also mirrored 404 from a first of the parallel current paths to second and third of the parallel current paths. Referring back to FIG. 3 again, one sees that this may be done using the transistors 314, 316, 320 of the first current mirror 324.

The method 400 continues with the provision 406 of a reference voltage (e.g., VREF), and feedback from the circuit, to a current steering mechanism comprising fourth and fifth of the parallel current paths. Current is then steered 408 between the first, second and third current paths by means of the current steering mechanism. Depending on the value of VDD and other considerations, VREF can be adjusted to provide an appropriate bias for the circuit.

The method 400 concludes with the output 410 of well-matched source and sink currents from the second current path. By way of example, the source and sink currents (e.g., I1 & I2; FIG. 3) may be output to a phase-locked loop in response to feedback received from the phase-locked loop.

Figure 5:
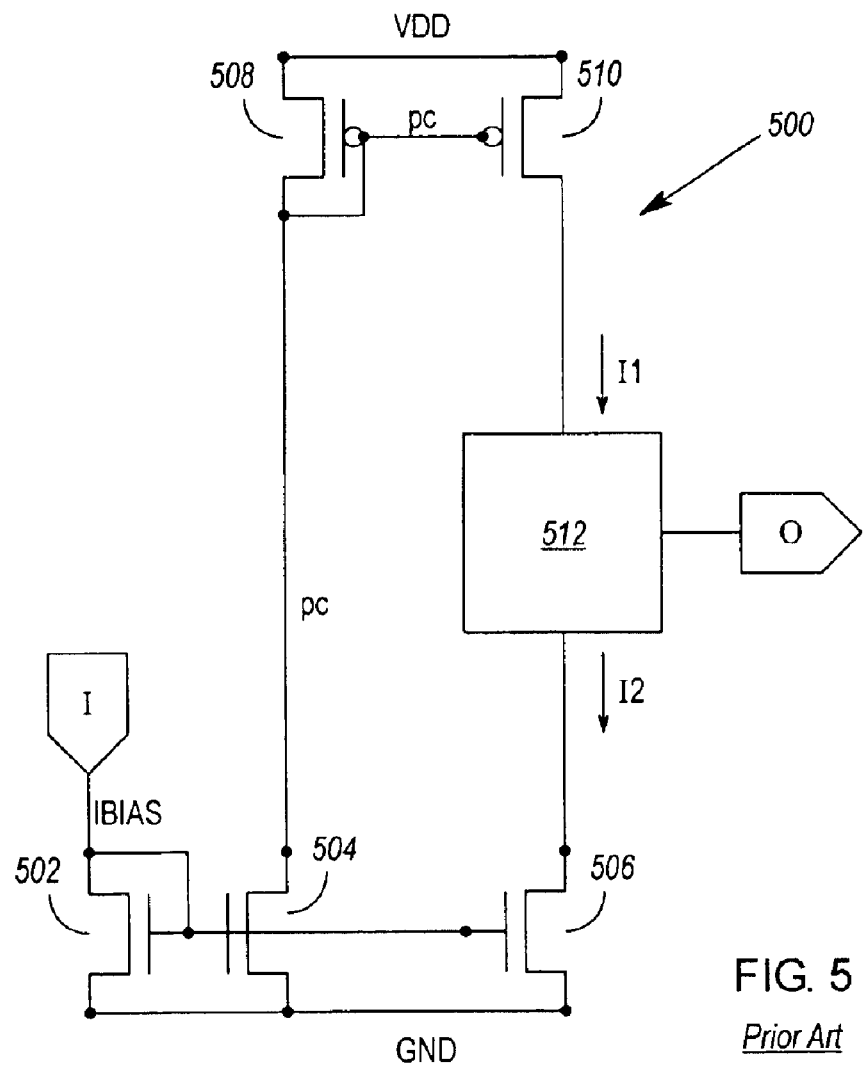
FIG. 5 illustrates a first prior art method for providing source and sink currents.
Figure 6:
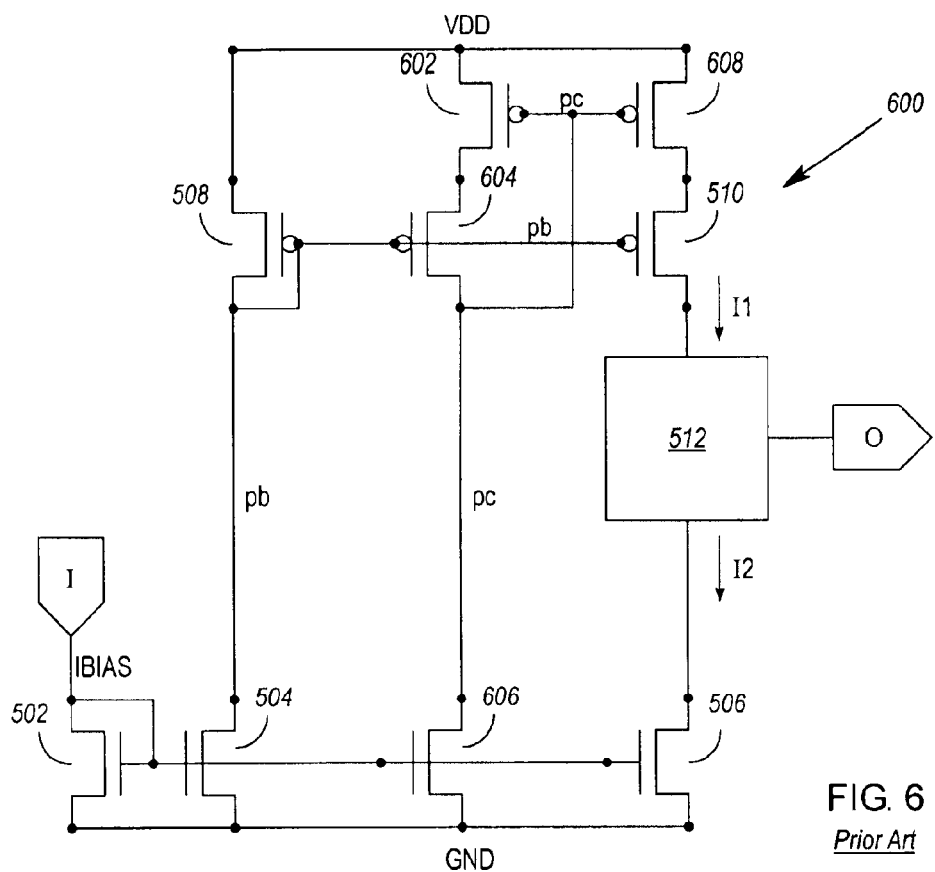
FIG. 6 illustrates a second prior art method for providing source and sink currents.

Embodiments of the circuits 100, 200, 300 and method 400 disclosed in FIGS. 1–4 provide various advantages over other circuits (e.g., circuits 500 & 600; FIGS. 5 & 6) and methods used to provide matched source and sink currents.

In FIG. 5, a diode-connected NFET 502 drives NFETS 504, 506 of a first current mirror, and a diode-connected PFET 508 drives a PFET 510 a second current mirror, thereby providing source and sink currents (I1 and I2) to a device 512. Compared to the circuit 500 illustrated in FIG. 5, the circuits 100, 200, 300 and method 400 illustrated in FIGS. 1–4 can provide a higher output impedance and more precisely matched source and sink currents. The well-matched source and sink currents of circuits 100, 200, 300 are at least partly due to the feedback provided to the current steering mechanism of each circuit. Although feedback could be added to the circuit 500 illustrated in FIG. 5, this would require the overhead and complexity of an operational amplifier (op-amp). The output impedance of the circuit 500 could also be increased, but this is typically done using a cascode current source, and most cascode current sources require more power supply headroom than is generally available in today's integrated circuit (IC) processes.

The circuit 600 illustrated in FIG. 6 adds an additional current mirror leg 602, 604, 606 and over-the-shoulder cascode current mirror 602, 608 to the circuit 500 illustrated in FIG. 5. Compared to the circuit 500 illustrated in FIG. 5, the circuit 600 illustrated in FIG. 6 provides higher output impedance and more reasonable power supply headroom requirements. However, feedback is difficult to implement in the circuit 600 because the FETS 602 and 604 tend to correct for changes made to each other. The circuits 100, 200, 300 and method 400 illustrated in FIGS. 1–4, on the other hand, can provide all of the advantages of the circuit 600 illustrated in FIG. 6, but with the addition of an easily adjusted feedback mechanism. By incorporating feedback, the circuits 100, 200, 300 and method 400 illustrated in FIGS. 1–4 provides more precisely matched source and sink currents.

Another advantage provided by at least some embodiments of the circuits 100, 200, 300 and method 400 is the minimization of phase offsets.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. Apparatus for providing well-matched source and sink currents, comprising:
   a) a number of parallel current paths,
      i) a first of which drives a first current mirror to mirror current to second and third of the parallel current paths;
      ii) the second of which provides well-matched source and sink currents as outputs;
      iii) the third of which is matched to the second;
      iv) a fourth and fifth of which each comprise a transistor of a current steering mechanism and a bias transistor; wherein a first transistor of the current steering mechanism is coupled in the fourth current path and is driven by feedback from the third current path; wherein a second transistor of the current steering mechanism is coupled in the fifth current path and is driven by a reference voltage; wherein the bias transistor of the fourth current path mirrors current to the first current path under control of the current steering mechanism; and wherein the bias transistor of the fifth current path mirrors current to the second and third current paths under control of the current steering mechanism; and
   b) a second current mirror, driven by a bias current, to mirror said bias current to each of the number of parallel current paths.

2. The apparatus of claim 1, wherein the first current mirror comprises an over-the-shoulder cascode current mirror.

3. The apparatus of claim 1, further comprising up/down current switches coupled to receive said source and sink output currents and pump up/down currents into a phase-locked loop in response to feedback received from the phase-locked loop.

4. The apparatus of claim 3, further comprising hardwired up/down current switches, coupled in the third current path and matched to the up/down current switches receiving said source and sink output currents.

5. The apparatus of claim 1, wherein the second current mirror comprises a transistor in each of the number of parallel current paths, each of which comprises a gate driven by the bias current, and each of which is coupled in one of the parallel current paths to sink current from the parallel current path.

6. The apparatus of claim 1, wherein the second and third parallel current paths comprise matched pairs of transistors, each matched pair being laid out using common centroid layout techniques.

7. The apparatus of claim 1, wherein the bias transistors of the fourth and fifth current paths mirror current to the first, second and third current paths by driving transistors in the first, second and third current paths; and wherein the bias transistors are sized to about 25% of the driven transistors.

8. The apparatus of claim 1, wherein each of the second and third current paths comprises a pair of series transistors to source current to the current path; wherein first transistors of the series pairs form part of the first current mirror; and wherein second transistors of the series pairs are driven by the bias transistor of the fifth current path.

9. Apparatus for providing well-matched source and sink currents, comprising:
   a) a first current path providing well-matched source and sink currents as outputs; the source current being provided through a first pair of series transistors;
   b) a second current path, coupled in parallel with the first current path; the second current path comprising a second pair of series transistors, matched to the first pair of series transistors;
   c) a first current mirror mirroring current to first corresponding transistors of the first and second pairs of series transistors;
   d) a second current mirror mirroring current to second corresponding transistors of the first and second pairs of series transistors;
   e) a current steering mechanism receiving a feedback signal from the second current path, as well as a reference signal, and steering current between the first and second current sources to match the feedback signal to the reference signal; and
   f) a third current mirror mirroring a bias current to the first and second current paths, the first current mirror, and the current steering mechanism.

10. The apparatus of claim 9, wherein the first current mirror is an over-the-shoulder cascode current mirror.

11. The apparatus of claim 9, wherein corresponding transistors in the first and second current paths are laid out using common centroid layout techniques.

12. The apparatus of claim 9, further comprising up/down current switches coupled to receive said source and sink output currents and pump up/down currents into a phase-locked loop in response to feedback received from the phase-locked loop.

13. The apparatus of claim 12, further comprising hardwired up/down current switches, coupled in the second current path and matched to the up/down current switches receiving said source and sink output currents.

14. A method for providing well-matched source and sink currents, comprising:
   a) mirroring a bias current to each of a number of parallel current paths of a circuit;
   b) mirroring the bias current again, from a first of the parallel current paths to second and third of the parallel current paths; the second and third current paths being matched;
   c) providing a reference voltage, and feedback from the circuit, to a current steering mechanism comprising fourth and fifth of the parallel current paths;
   d) steering current between the first, second and third current paths by means of the current steering mechanism; and
   e) outputting well-matched source and sink currents from the second current path.

15. The method of claim 14, further comprising, in response to feedback received from a phase-locked loop, outputting the source and sink currents to the phase-locked loop.

16. The method of claim 15, further comprising hardwiring up/down current switches in the third current path; the construction of the up/down current switches being similar to that used to implement switches that output the source and sink currents to the phase-locked loop.

17. The method of claim 14, further comprising, matching pairs of transistors in the second and third current paths, and laying out each matched pair of transistors using common centroid layout techniques.

18. The method of claim 14, wherein the provided feedback is derived from the third current path.

* * * * *